(12) United States Patent
Tai et al.

(10) Patent No.: US 8,502,945 B2
(45) Date of Patent: Aug. 6, 2013

(54) ARRAY SUBSTRATE OF FRINGE FIELD SWITCHING MODE LIQUID CRYSTAL DISPLAY PANEL AND METHOD OF MANUFACTURING THE SAME

(75) Inventors: Meng-Chieh Tai, Guangdong (CN);
Ming-Tsung Wang, Guangdong (CN);
Chih-Chung Liu, Guangdong (CN);
De-Jiun Li, Guangdong (CN)

(73) Assignee: Century Technologh ShenzhenCorporation Limited, Shenzhen (CN)

( * ) Notice: Subject to any disclaimer, the term of this patent is extended or adjusted under 35 U.S.C. 154(b) by 296 days.

(21) Appl. No.: 12/962,673

(22) Filed: Dec. 8, 2010

(65) Prior Publication Data
US 2012/0092606 A1 Apr. 19, 2012

(30) Foreign Application Priority Data
Oct. 14, 2010 (CN) .......................... 2010 1 0507114

(51) Int. Cl.
*G02F 1/1343* (2006.01)

(52) U.S. Cl.
USPC .......................................................... 349/141

(58) Field of Classification Search
None
See application file for complete search history.

(56) References Cited

U.S. PATENT DOCUMENTS
2001/0007779 A1* 7/2001 Lee et al. ........................ 438/30

* cited by examiner

*Primary Examiner* — Lucy Chien
(74) *Attorney, Agent, or Firm* — Altis Law Group, Inc.

(57) ABSTRACT

An array substrate of a fringe field switching (FFS) mode liquid crystal display (LCD) panel and manufacturing method thereof are provided. The gate electrodes and the common electrode of the FFS mode LCD panel are formed on the array substrate by the same photolithographic process, and the common electrode, the gate lines and the gate electrodes are disposed on the same layer.

20 Claims, 11 Drawing Sheets

ARRAY SUBSTRATE OF FRINGE FIELD SWITCHING MODE LIQUID CRYSTAL DISPLAY PANEL AND METHOD OF MANUFACTURING THE SAME

BACKGROUND OF THE INVENTION

1. Field of the Invention

The present invention relates to an array substrate of a fringe field switching (FFS) mode liquid crystal display (LCD) panel and method of manufacturing the same, and more particularly, to an array substrate of an FFS mode LCD panel and method of manufacturing the same in which the gate electrodes, the gate lines and the common electrode are disposed on the same layer and patterned by the same photolithographic process.

2. Description of the Prior Art

Liquid crystal display panels, based on different directions of applied electric field that drives the liquid crystal, may be broadly classified into vertical electric field type LCD panels and horizontal electric field type LCD panels.

In a horizontal electric field type LCD panel, the liquid crystal molecules sealed within are driven by a horizontal electric field formed between a common electrode and a pixel electrode. Due to the common electrode and the pixel electrode arranged in parallel on the same plane of the lower substrate, the liquid crystal is able to be driven by the horizontal electric field generated between the common electrode and the pixel electrode. Therefore, the horizontal electric field type LCD panel is also known as an in-plane switching (hereinafter, referred to as "IPS") mode LCD. The IPS mode LCD panel has an advantage of wider viewing angle, but often accompanied with a disadvantage in that the aperture ratio and transmittance are relatively low.

In order to improve the aperture ratio and transmittance of the IPS mode LCD panel, there has been proposed a fringe field switching (FFS) mode LCD panel wherein the liquid crystal molecules are driven by a fringe electric field formed between a common electrode and a pixel electrode in which the pixel electrode is either disposed over the common electrode on the lower substrate or arranged below the common electrode on the lower substrate. Either one of the common electrode or the pixel electrode includes a plurality of slits and stripe electrodes so that the fringe electric field is generated thereto.

In an FFS mode LCD panel, the common electrode and the pixel electrode formed on the lower substrate are both made of a transparent conducting material such as indium tin oxide (ITO), and a distance between the common electrode and the pixel electrode is smaller than a distance between the upper and lower substrates. In addition, either the common electrode or the pixel electrode would have a sufficient width so that the liquid crystal molecules above the pixel electrode and the common electrode can be all driven. Since the pixel electrode and the common electrode are both made of transparent conducting material which is light permeable, the FFS mode LCD panel obtains an improved aperture ratio and transmittance over the IPS mode LCD panel.

There has been a proposed method of manufacturing an FFS mode LCD panel, which requires six photolithographic processes to form the array substrate of the FFS mode LCD panel. However, this conventional method suffers from high manufacturing complexity and high cost.

SUMMARY OF THE INVENTION

It is therefore one of the objectives of the present invention to provide an array substrate of an FFS mode LCD panel and method of manufacturing the same to reduce the complexity of the process and further to cut the cost.

According to the present invention, a method of forming an array substrate of an FFS mode LCD panel is provided. The method includes the following steps. A substrate is provided and a plurality of gate lines, a plurality of gate electrodes, and a common electrode are formed on the substrate by a first photolithographic process. The first photolithographic process includes forming a first conducting layer on the substrate and forming a patterned photoresist on the first conducting layer; removing the first conducting layer unblocked by the patterned photoresist to form the gate lines and the gate electrodes on the substrate; forming a first transparent conducting layer covering the substrate and the patterned photoresist; and removing the patterned photoresist as well as the first transparent conducting layer covering the patterned photoresist to form the common electrode on the substrate. Subsequently, a gate insulating layer is formed covering the substrate, the gate lines, the gate electrodes, and the common electrode. A semiconductor layer is then formed on the gate insulating layer by a second photolithographic process. A plurality of data lines, a plurality of source electrodes and a plurality of drain electrodes are formed on the gate insulating layer and the semiconductor layer by a third photolithographic process. A passivation layer is formed on the gate insulating layer, the data lines, the source electrodes, and the drain electrodes by a fourth photolithographic process, wherein the passivation layer has a plurality of first contact holes at least partially exposing the respective drain electrodes. A plurality of pixel electrodes are then formed on the passivation layer by a fifth photolithographic process, wherein each of the pixel electrodes is electrically connected to the corresponding drain electrode through the corresponding first contact hole.

According to the present invention, an array substrate of an FFS mode LCD panel is provided. The array substrate of the FFS mode LCD panel includes a substrate, a gate line disposed on the substrate, a data line disposed on the substrate, and a thin film transistor disposed on the substrate. The thin film transistor includes a gate electrode electrically connected to the gate line, a gate insulating layer disposed on the gate electrode, and a semiconductor layer disposed on the gate insulating layer having a source electrode and a drain electrode disposed on the semiconductor layer, wherein the source electrode is electrically connected to the data line. The array substrate of the FFS mode LCD panel further includes a common electrode disposed between the substrate and the gate insulating layer, a passivation layer disposed on the gate insulating layer, and a pixel electrode disposed on the passivation layer. The common electrode and the gate electrode are coplanar. The passivation layer has a first contact hole at least partially exposing the drain electrode. The pixel electrode is electrically connected to the drain electrode through the first contact hole.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
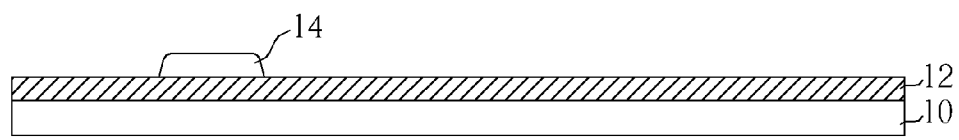
FIGS. 1-6 are schematic diagrams illustrating a method of forming an array substrate of an FFS mode LCD panel.
Figure 1B:
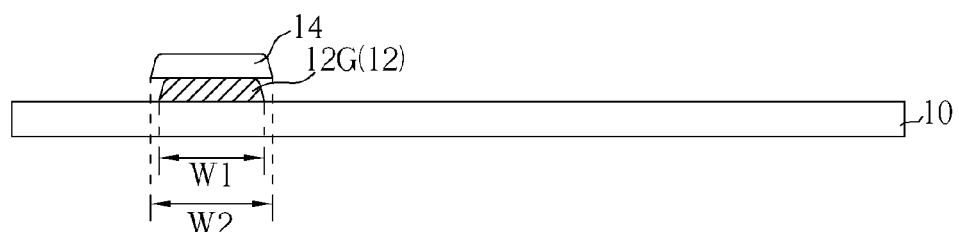

To provide a better understanding of the present invention, the preferred embodiments will be made in detail. The preferred embodiments of the present invention are illustrated in the accompanying drawings with numbered elements. In addition, the terms such as "first" and "second" described in the present invention are used to distinguish different components or processes, which do not limit the sequence of the components or processes.

Please refer to FIGS. 1-6. FIGS. 1-6 are schematic diagrams illustrating a method of forming an array substrate of an FFS mode LCD panel, where FIG. 1 including FIGS. 1A-1C are cross-sectional view diagrams, FIG. 2A, FIG. 3A, FIG. 4A, FIG. 5A and FIG. 6A are top-view diagrams, and FIG. 2B, FIG. 3B, FIG. 4B, FIG. 5B and FIG. 6B are cross-sectional view diagrams taken along cross-sectional lines I-I', II-II', III-III' and IV-IV'. As shown in FIG. 1A, a substrate (also referred to as lower substrate) 10 is provided. The substrate 10 may be a transparent substrate, e.g. a glass substrate, a plastic substrate, or a quartz substrate, but not limited thereto. Subsequently, a first photolithographic process including the following steps is performed. First, a first conducting layer 12 is formed on the substrate 10. The first conducting layer 12 is made of conducting material, e.g. metal such as aluminum (Al), copper (Cu), molybdenum (Mo), but not limited thereto. In the preferred embodiment, for example, the first conducting layer 12 may also be a composite-layered structure, e.g. a Mo/Al/Mo structure, a Mo/Al structure or a multiple-layered Al structure, but not limited thereto. Then, a patterned photoresist 14 is formed on the first conducting layer 12 to block portions of the first conducting layer 12, wherein the portions blocked by the patterned photoresist 14 may be used to form the gate lines, gate electrodes, the gate pad lower electrodes, and the common line. In this embodiment, the patterned photoresist 14 may be, for instance, patterned by an exposure process with a photomask (also referred to reticle) (not shown). As shown in FIG. 1B, the first conducting layer 12 unblocked by the patterned photoresist 14 is then removed, for instance by etching, to form a plurality of gate lines (not shown in FIG. 1), a plurality of gate electrodes 12G, a plurality of gate pad lower electrodes 12P (not shown in FIG. 1) and a common line (not shown in FIG. 1) on the substrate 10. Each of the gate pad lower electrodes (not shown in FIG. 1) is connected to an end of the corresponding gate line. It is preferably in this embodiment that the first conducting layer 12 is etched, for instance, by controlling etching parameters such that the width of each of the gate lines is smaller than the width of the patterned photoresist 14 disposed thereon, the width of each of the gate electrodes 12G is smaller than the width of the patterned photoresist 14 disposed thereon, the width of each of the gate pad lower electrodes is smaller than the width of the patterned photoresist 14 disposed thereon, and the width of the common line is smaller than the width of the patterned photoresist 14. As shown in FIG. 1B, for instance, the width W1 of the gate electrode 12G is smaller than the width W2 of the patterned photoresist 14. The etching parameters that can be used to control the width of the gate line and the width of the gate electrode 12G may be, for example, the concentration of etching solution, the etching time, the process temperature, and the process pressure, but not limited thereto.

Figure 1C:
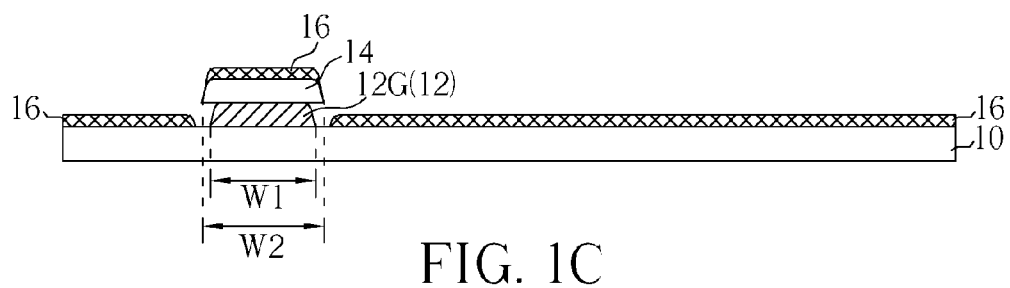
Figure 2A:
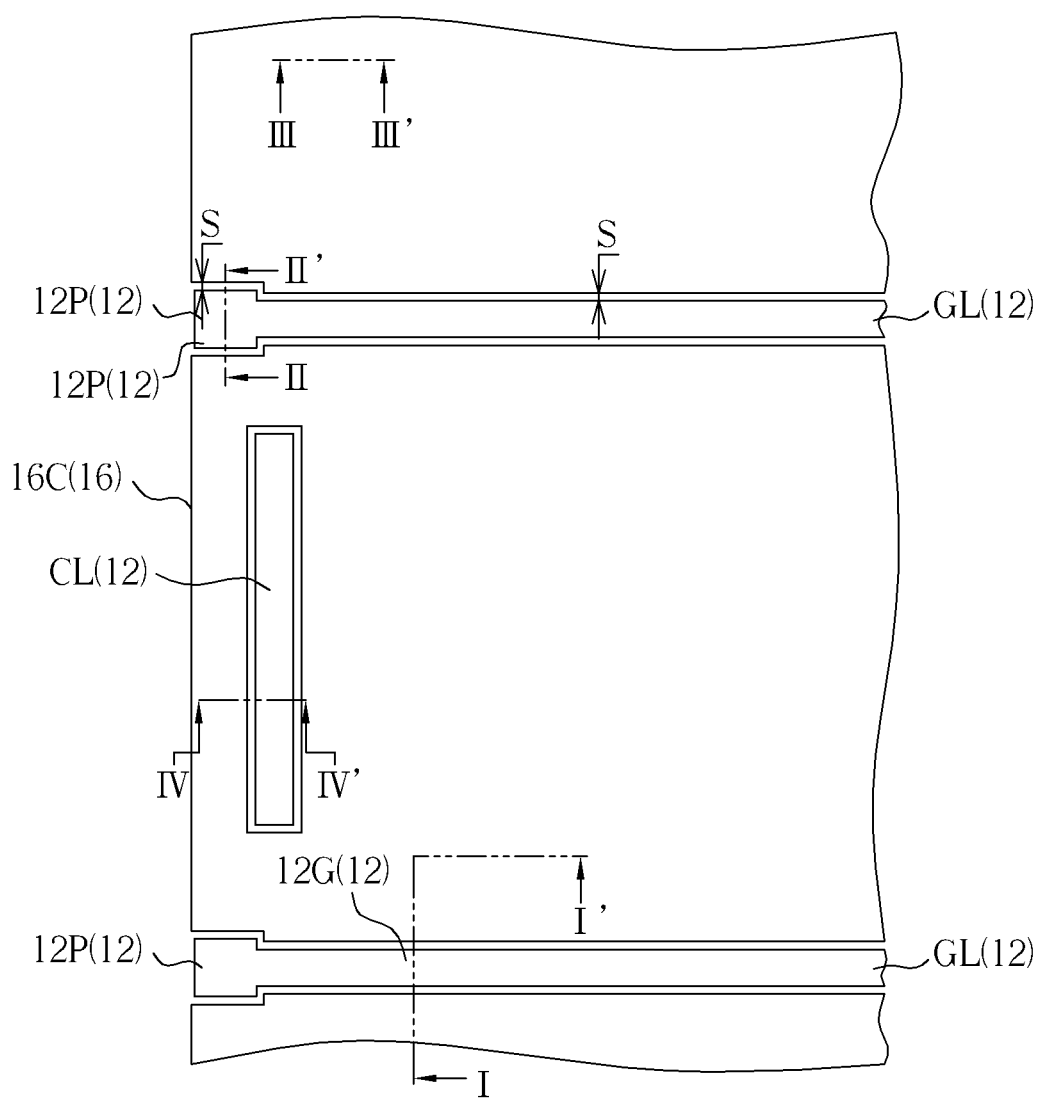
Figure 2B:
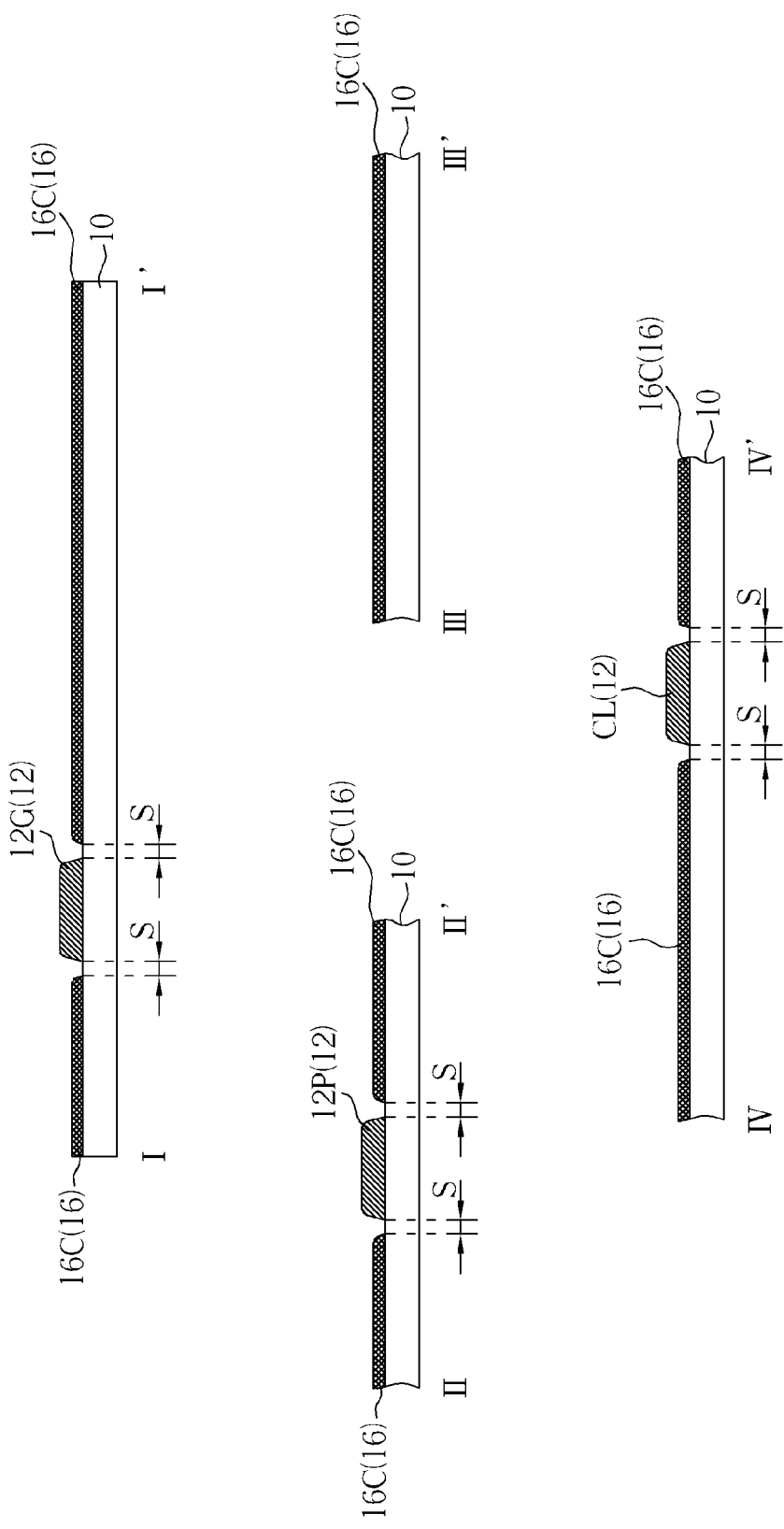

After the gate lines, the gate electrodes 12G, the gate pad lower electrodes and the common line are formed, a first transparent conducting layer 16 is formed covering the substrate 10 and the patterned photoresist 14 as shown in FIG. 1C. The first transparent conducting layer 16 is made of any suitable transparent conducting material such as ITO or IZO (indium zinc oxide), but not limited thereto. As shown in FIGS. 2A and 2B, the patterned photoresist 14 as well as the first transparent conducting layer 16 covering the patterned photoresist 14 are striped altogether to form a common electrode 16C on the substrate 10. It can be seen that the common electrode 16C is patterned by the same patterned photoresist 14 used to form the gate lines GL, the gate electrodes 12G, the gate pad lower electrodes 12P, and the common line CL, as a result, no extra photolithographic process is required to pattern the common electrode 16C. Accordingly, the common electrode 16C, the gate electrodes 12G, the gate lines GL, the gate pad lower electrodes 12P and the common line CL are coplanar, i.e. the common electrode 16C, the gate lines GL, the gate electrodes 12G, the gate pad lower electrodes 12P, and the common line CL are disposed on the same layer. Also, since the width of each of the gate lines GL is smaller than the width of the patterned photoresist 14 disposed thereon, the width of each of the gate electrodes 12G is smaller than the width of the patterned photoresist 14 disposed thereon, the width of each of the gate pad lower electrodes 12P is smaller than the width of the patterned photoresist 14 disposed thereon, and the width of each of the common line CL is smaller than the width of the patterned photoresist 14 disposed thereon, a gap S between the common electrode 16C and the gate lines GL, a gap S between the common electrode 16C and the gate electrodes 12G, a gap S between the common electrode 16C and the gate pad lower electrodes 12P, and a gap S between the common electrode 16C and the common line CL are simultaneously created. As a result of said gap S, the common electrode 16C is ensured to be insulated from the gate lines GL, the gate electrodes 12G, the gate pad lower electrodes 12P, and the common line CL. In this embodiment, the gap S between the gate line GL and the common electrode 16C, and the gap S between the gate electrodes 12G and the common electrode 16C, the gap S between the gate pad lower electrode 12P and the common electrode 16C, and the gap S between the common line CL and the common electrode 16C are preferably ranged from 0.2 micrometers to 2 micrometers exists, but not limited thereto. The above range of the gap S is preferable for the following reasons. When the gap S is smaller than 0.2 micrometers, short circuit tends to occur between the common electrode 16C and the gate line GL or the gate electrode 12G/the gate pad lower electrode 12P. When the gap S is larger than 2 micrometers, more process time to etch the first conducting layer 12 is required. The larger the gap S is, the smaller the aperture ratio becomes because a relatively large area of black matrix (not shown) will be necessarily applied to the LCD to avoid light leakage caused by the larger gap S. In other words, a smaller gap S will need a smaller BM causing less impact to the aperture ratio.

Figure 3A:
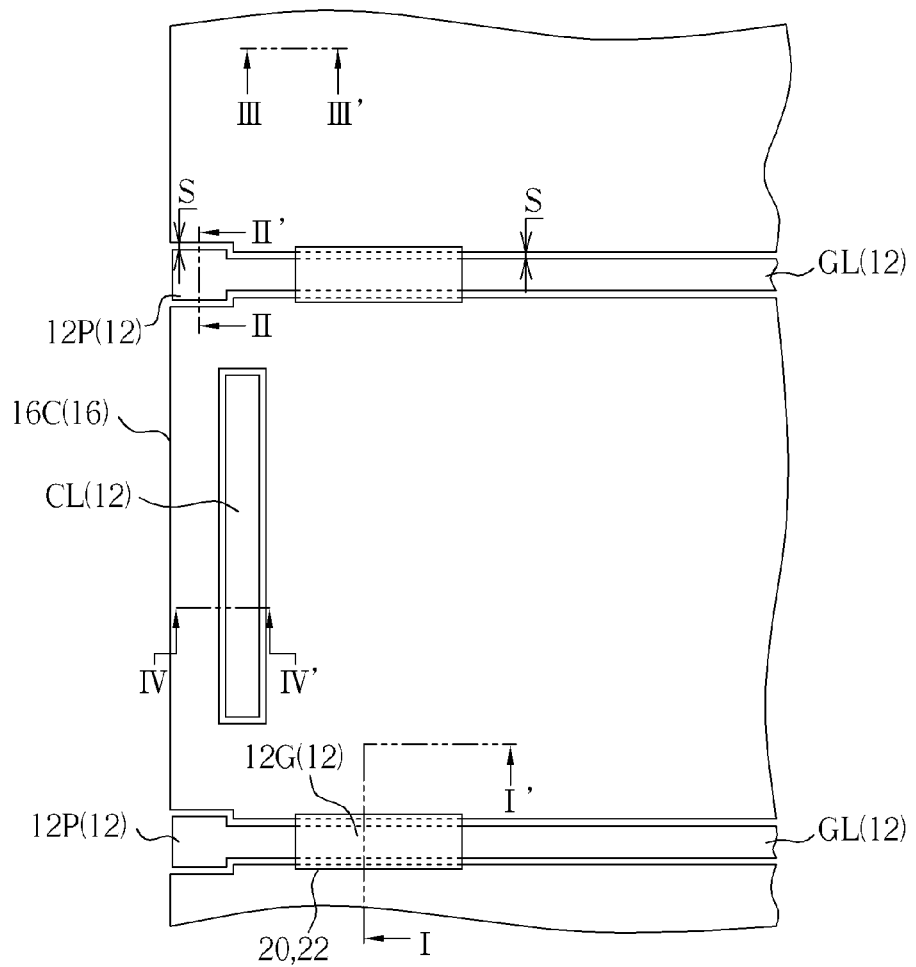
Figure 3B:
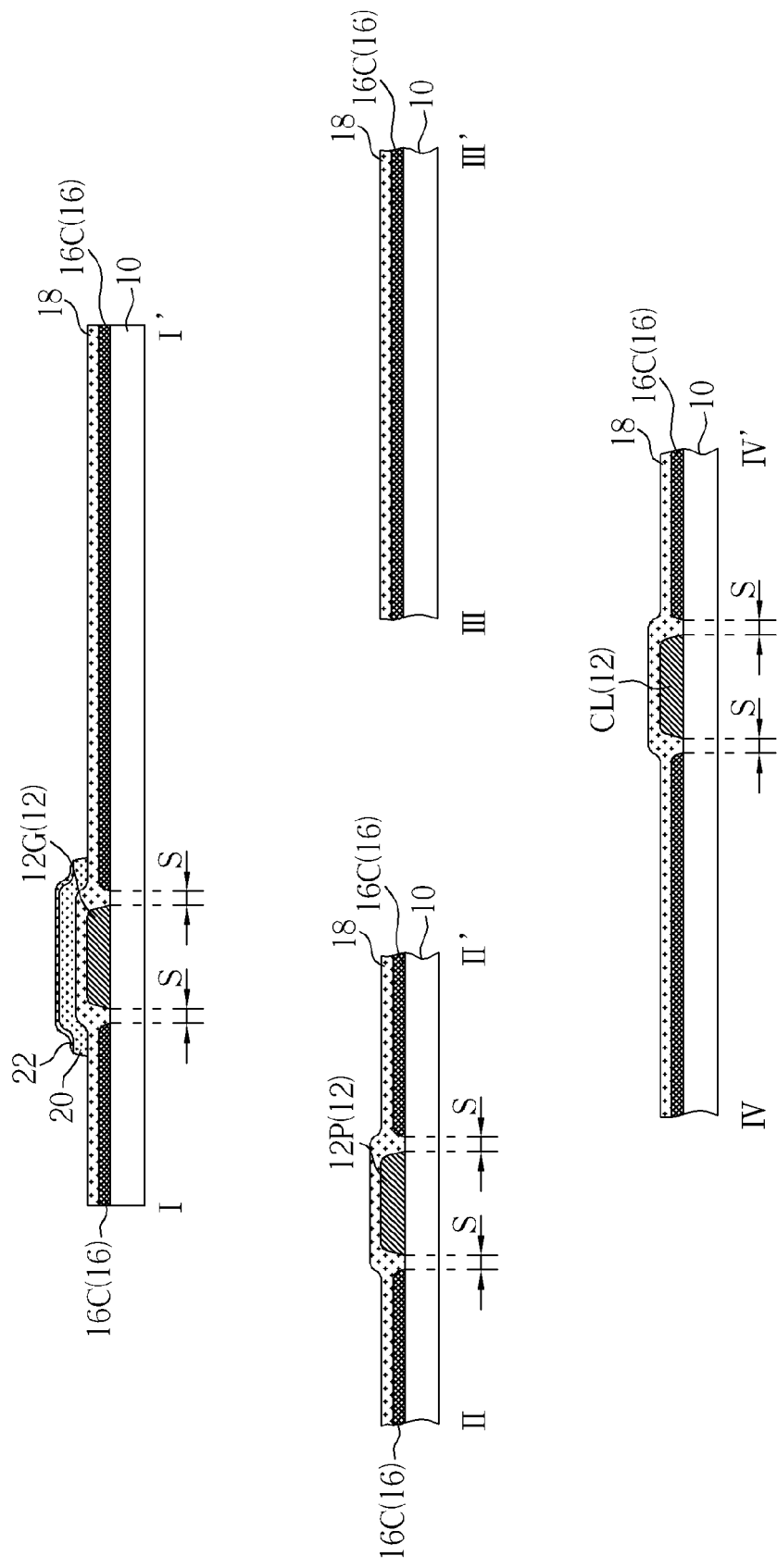

As shown in FIGS. 3A and 3B, a gate insulating layer 18 (not shown in FIG. 3A) is then formed to cover the substrate 10, the gate lines GL, the gate electrodes 12G, the gate pad lower electrode 12P, the common line CL and the common electrode 16C. The gate insulating layer 18 is made of dielectric material, e.g. silicon oxide, silicon nitride or silicon oxynitride, but not limited thereto. Subsequently, a second photolithographic process is performed to form a semiconductor layer 20 on the gate insulating layer 18. The semiconductor layer 20 is disposed substantially corresponding to the gate electrodes 12G, and serves as a channel layer. It is noted that in order to improve the ohmic contact between the semiconductor layer 20 and the source/drain to be formed in the next process, an ohmic contact layer 22 can be optionally formed on the semiconductor layer 20 and patterned along with the semiconductor layer 20 by the second photolithographic process. The semiconductor layer 20 and the ohmic contact layer 22 may be both made of semiconductor material such as amorphous silicon, but not limited thereto. The ohmic contact layer 22 is heavily doped, for example n-type (N+), while the semiconductor layer 20 is lightly doped.

Figure 4A:
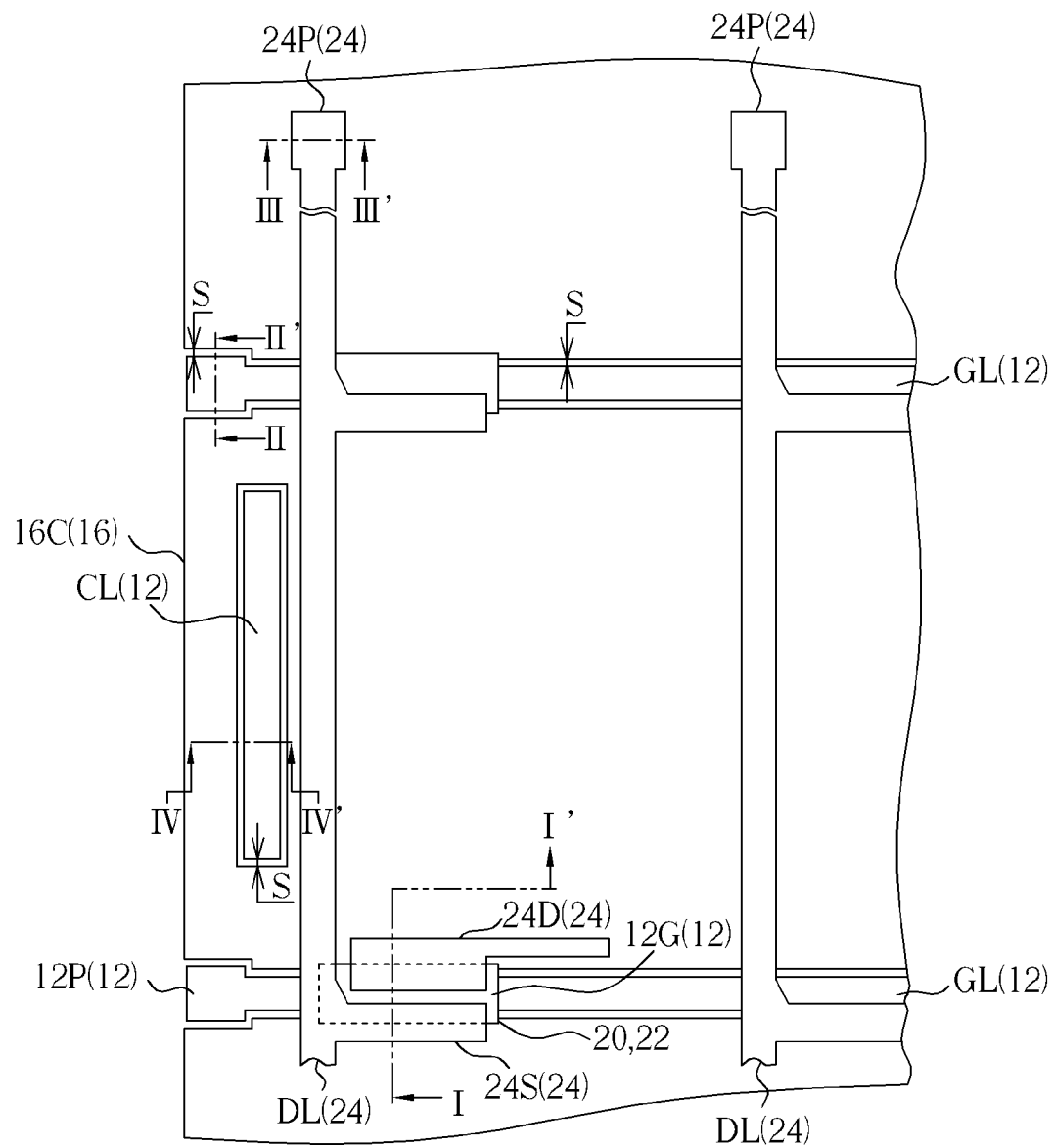
Figure 4B:
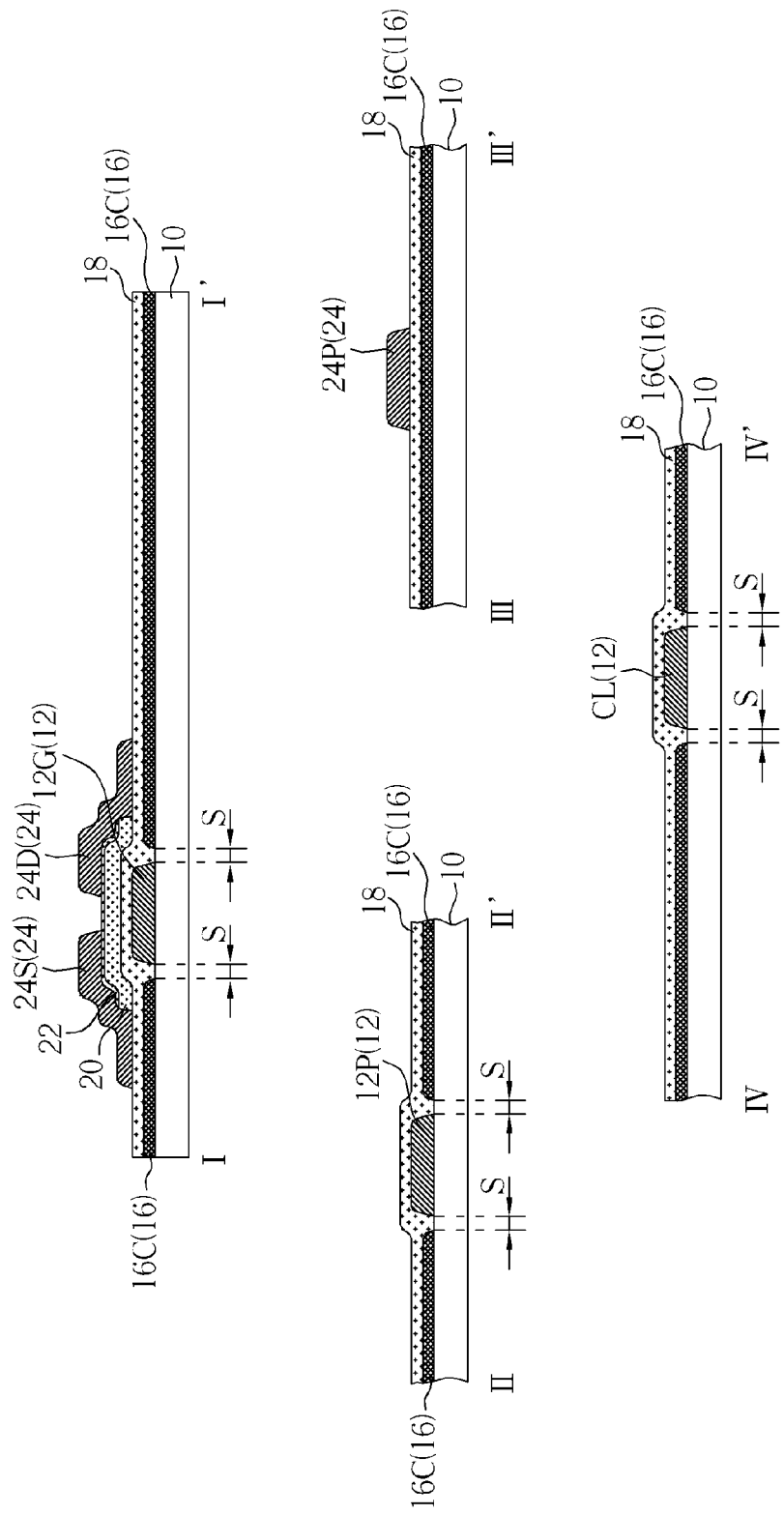

As shown in FIGS. 4A and 4B, a second conducting layer 24 is formed on the gate insulating layer 18, the semiconductor layer 20, and the ohmic contact layer 22. The second conducting layer 24 is made of conducting material, e.g. metal such as Al, Cu, Mo, but not limited thereto. In the preferred embodiment, for example, the conducting material may also be a composite-layered structure, e.g. a Mo/Al/Mo structure, a Mo/Al structure, or a multiple-layered Al structure, but not limited thereto. Subsequently, a third photolithographic process is performed to pattern the second conducting layer 24 to form a plurality of data lines DL, a plurality of source electrodes 24S, a plurality of drain electrodes 24D, and a plurality of data pad lower electrodes 24P on the gate insulating layer 18. The data lines DL are arranged perpendicularly to the gate lines GL, forming a plurality of sub-pixel regions. Each of the source electrodes 24S and the corresponding drain electrodes 24D at least partially cover two opposite sides of the corresponding semiconductor layer 20, forming a thin film transistor TFT with the corresponding gate electrode 12G. Each of the data pad lower electrodes 24P is connected to an end of the corresponding data line DL. It is appreciated that in the third photolithographic process, the ohmic contact layer 22 is patterned again so that the ohmic contact layer 22 is disposed corresponding to the source electrodes 24S and the drain electrodes 24D, i.e. the ohmic contact layer 22 is located between the semiconductor layer 20 and the source electrodes 24S, and between the semiconductor layer 20 and the drain electrodes 24D for forming the ohmic contact between the semiconductor layer 20 and the source electrodes 24S or drain electrodes 24D.

Figure 5A:
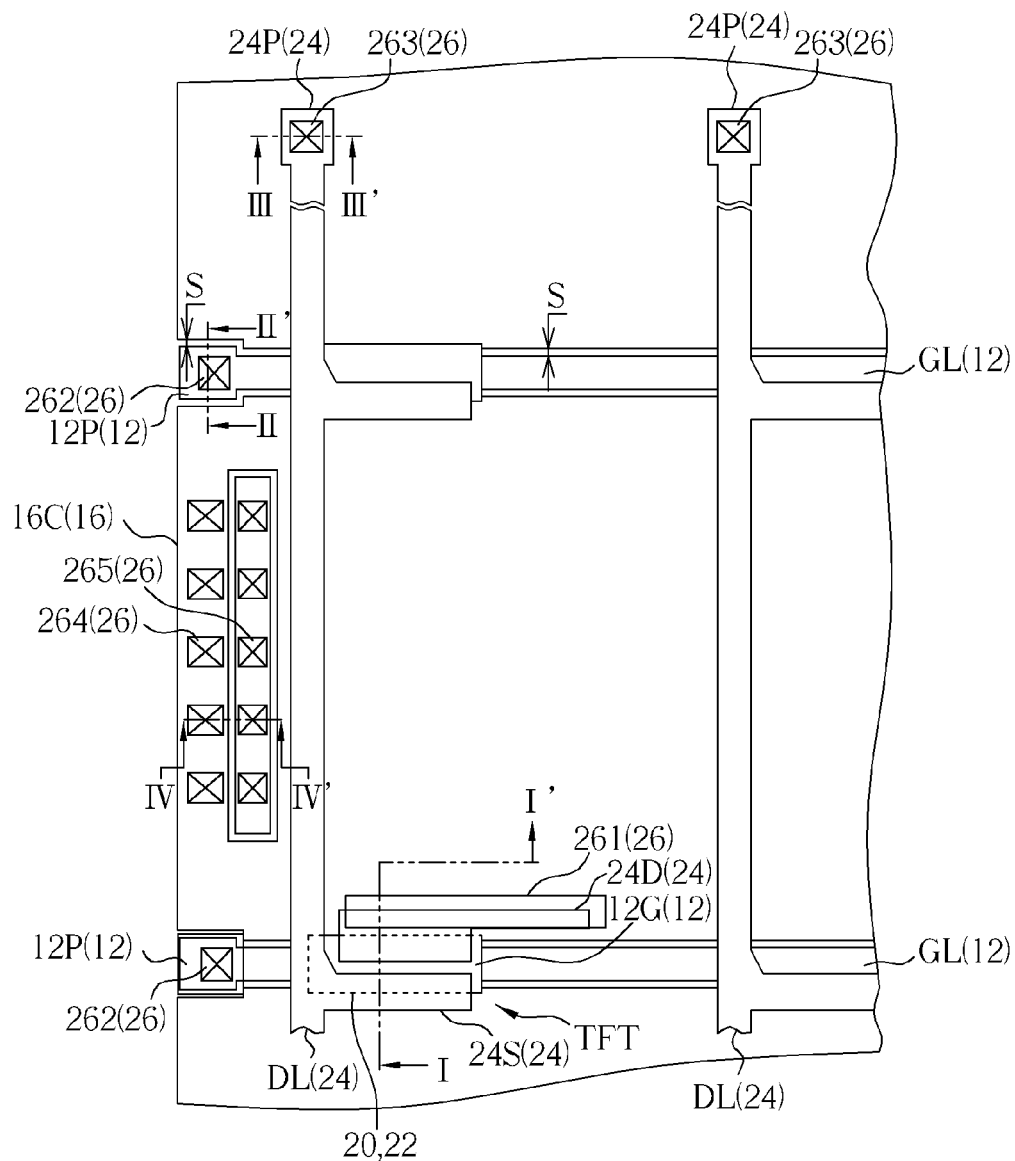
Figure 5B:
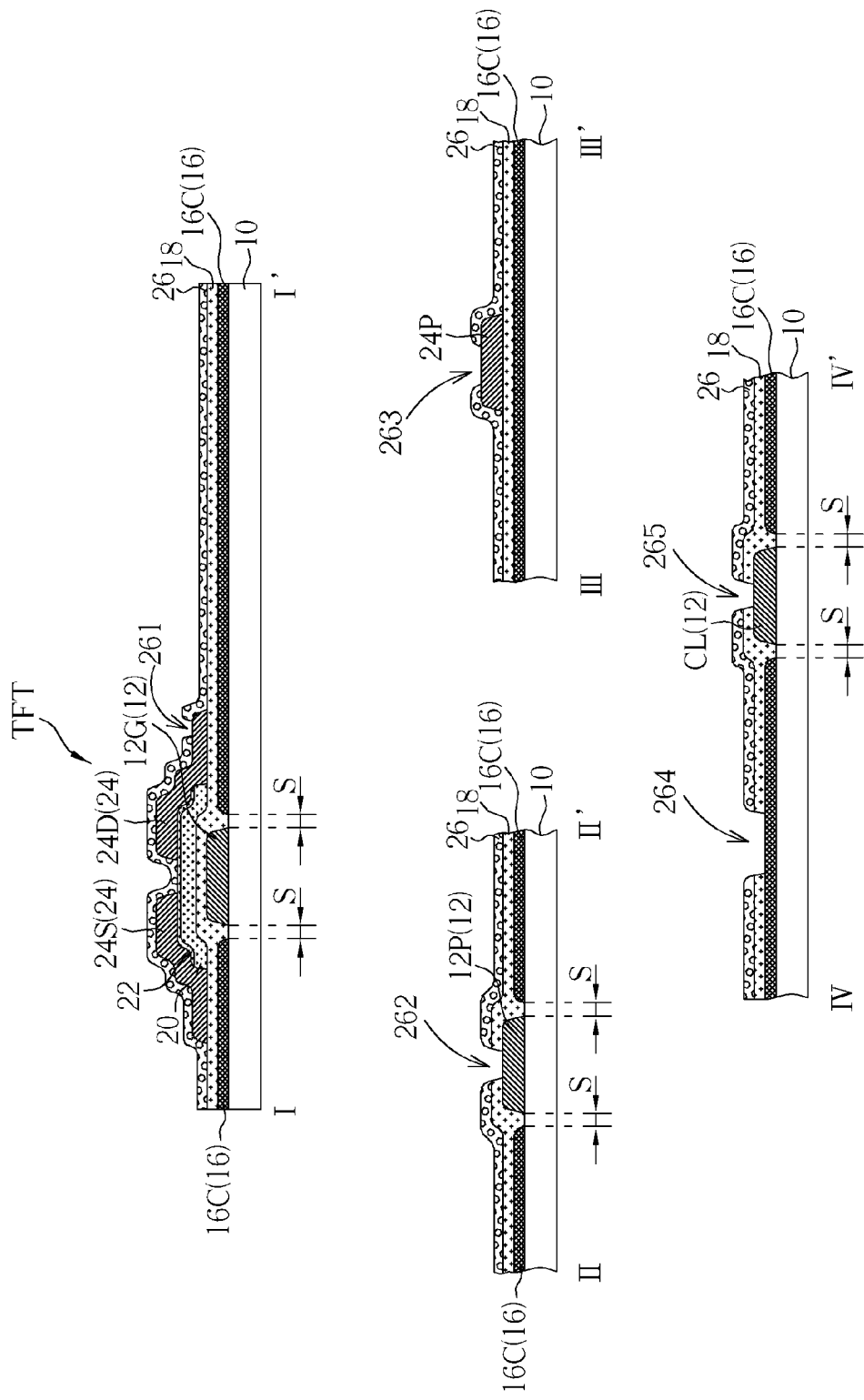

As shown in FIGS. 5A and 5B, a passivation layer 26 is then formed on the gate insulating layer 18, the data lines DL, the source electrodes 24S, the drain electrodes 24D, the ohmic contact layer 22, and the data pad lower electrodes 24P. The passivation layer 26 may be made of inorganic material, e.g. silicon nitride, or organic material, e.g. acryl resin. A fourth photolithographic process is then performed to pattern the passivation layer 26 to form a plurality of first contact holes 261, a plurality of second contact holes 262, a plurality of third contact holes 263, a plurality of fourth contact holes 264, and a plurality of fifth contact holes 265. Each of the first contact holes 261 penetrates through the passivation layer 26 and at least partially exposes the drain electrodes 24D respectively. Each of the second contact holes 262 penetrates through the passivation layer 26 and the gate insulating layer 18 and partially exposes the corresponding gate pad lower electrode 12P. Each of the third contact holes 263 penetrates through the passivation layer 26 and partially exposes the corresponding data pad lower electrode 24P. Each of the fourth contact holes 264 penetrates through the passivation layer 26 and the gate insulating layer 18, and partially exposes the common electrode 16C. Each of the fifth contact holes 265 penetrates through the passivation layer 26 and the gate insulating layer 18, and partially exposes the common line CL.

Figure 6A:
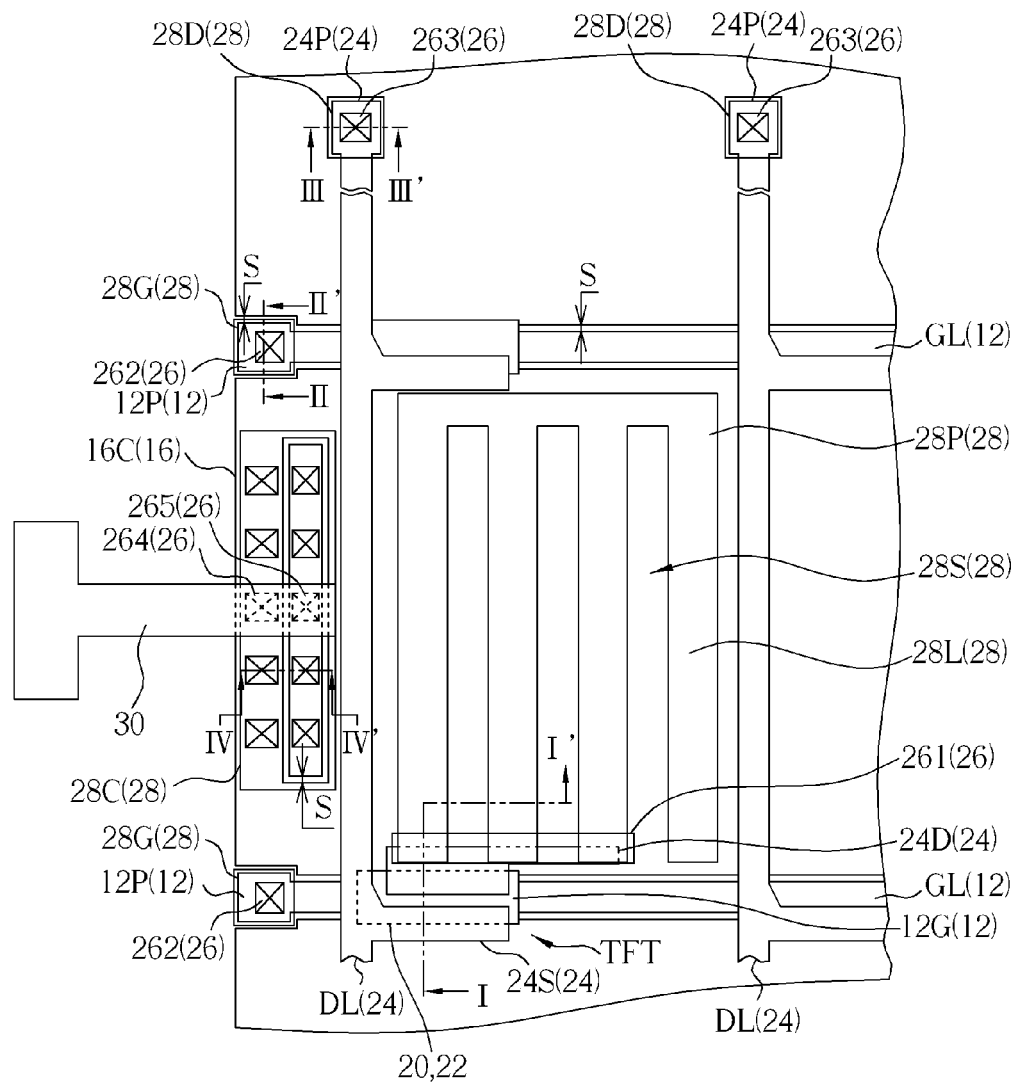
Figure 6B:
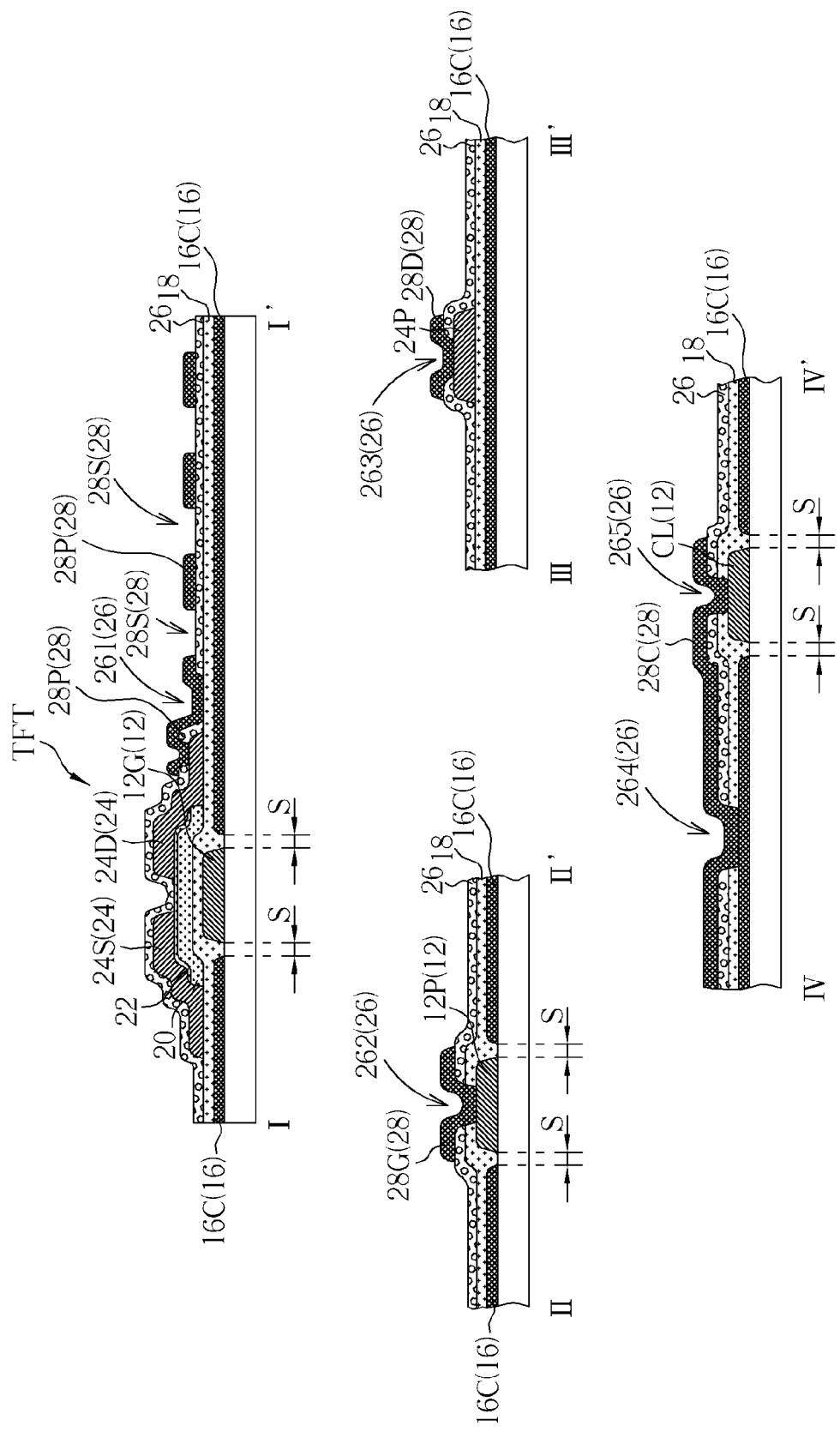

As shown in FIGS. 6A and 6B, a second transparent conducting layer 28 is formed on the passivation layer 26. The second transparent conducting layer 28 is made of any suitable transparent conducting material such as ITO or IZO, but not limited thereto. Subsequently, a fifth photolithographic process is performed to pattern the second transparent conducting layer 28 to form a plurality of pixel electrodes 28P, a plurality of gate pad upper electrodes 28G, a plurality of data pad upper electrodes 28D, and a connection line 28C on the passivation layer 26. In other words, the gate pad upper electrodes 28G, the data pad upper electrodes 28D, the pixel electrodes 28P, and the connection line 28C may be made of the same transparent conducting material. Each of the pixel electrodes 28P is disposed corresponding to the sub-pixel region, and each of the pixel electrodes 28P is electrically connected to the corresponding drain 24D through the corresponding first contact hole 261. In addition, each of the pixel electrodes 28P has a plurality of stripe electrodes 28L arranged in parallel and electrically connected together, and a plurality of slits 28S arranged between the stripe electrodes 28L, i.e. each of the pixel electrodes 28P has a comb-like shape. The pixel electrode 28P may have any other shapes such as a boomerang-like shape. The pixel electrodes 28P are disposed over the common electrode 16C, and a fringe electric field may be generated between the common electrode 16C and each of the pixel electrodes 28P with the stripe electrodes 28L and the slits 28S. Each of the gate pad upper electrodes 28G is electrically connected to the corresponding gate pad lower electrode 12P through the second contact hole 262, and gate signal can be applied via the gate pad upper electrodes 28G. Each of the data pad upper electrodes 28D is electrically connected to the corresponding data pad lower electrode 24P through the third contact hole, and data signal can be applied via the data pad upper electrodes 28D. The connection line 28C is electrically connected to the common electrode 16C through the fourth contact hole 264 and electrically connected to the common line CL through the fifth contact hole 265, so that the common electrode 16C and the common line CL are electrically connected by the connection line 28C. The connection line 28C is also electrically connected to a common signal line 30, and common signal can be applied via common signal line 30 to the connection line 28C. The common signal line 30 may be, for instance, a metal line, and may be, for instance, made of the same conducting material as the data line DL or the same conducting material as the gate line GL, but not limited thereto. For example, the common signal line 30 may also be made of another conducting material different from that of the gate line GL and the data line DL.

Please refer to FIGS. 6A and 6B again. FIGS. 6A and 6B illustrate an array substrate of an FFS mode LCD panel according to an embodiment of the present invention, where FIG. 6B are cross-sectional diagrams taken along cross-sectional lines I-I', II-II', III-III' and IV-IV'. As shown in FIGS. 6A and 6B, the array substrate of an FFS mode LCD panel includes a substrate 10, a gate line GL disposed on the substrate 10, a data line DL disposed on the substrate 10, a gate pad lower electrode 12P electrically connected to an end of the gate line GL on the substrate 10, and a thin film transistor TFT disposed on the substrate 10. The thin film transistor TFT includes a gate electrode 12G electrically connected to the gate line GL, a gate insulating layer 18 disposed on the gate electrode 12G, a semiconductor layer 20 disposed on the gate insulating layer 18, and a source electrode 24S and a drain electrode 24D disposed on the semiconductor layer 20. The source electrode 24S is electrically connected to the data line DL. The array substrate of an FFS mode LCD panel further includes a common electrode 16C and a common line CL disposed between the substrate 10 and the gate insulating layer 18. The common line CL, the gate electrode 12G, the gate pad lower electrode 12P, and the gate line GL are made of the same conducting material. The common electrode 16C, the gate electrode 12G, the gate line GL, the common line CL and the gate pad lower electrode 12P are coplanar. Specifically, the common electrode 16C, the gate line GL, the gate electrode 12G, the common line CL and the gate pad lower electrode 12P are disposed on the same layer. There is a gap S between the gate line GL and the common electrode 16C, a gap S between the gate electrode 12G and the common electrode 16C, a gap S between the gate pad lower electrode 12P and the common electrode 16C, and the gap S between the common line CL and the common electrode 16C. In this embodiment, the gap S is substantially between 0.2 micrometers and 2 micrometers, but not limited thereto. The array substrate of an FFS mode LCD panel further includes a data pad lower electrode 24P electrically connected to an end of the data line DL, and the data pad lower electrode 24P, the data line DL, the source electrode 24S and the drain electrode 24D are made of the same conducting material. A passivation layer 26 is disposed on the gate insulating layer 18, and the passivation layer 26 has a first contact hole 261 at least partially exposing the drain electrode 24D, a second contact hole 262 partially exposing the gate pad lower electrode 12P, a third contact hole 263 partially exposing the data pad lower electrode 24P, a fourth contact hole 264 partially exposing the common electrode 16C, and a fifth contact hole 265 partially exposing the common line CL. The array substrate of an FFS mode LCD panel further includes a pixel electrode 28P, a connection line 28C, a gate pad upper electrode 28G and a data pad upper electrode 28D made of the same transparent conducting material and disposed on the passivation layer 26. The pixel electrode 28P is electrically connected to the drain electrode 24D through the first contact hole 261. The pixel electrode 28P has a plurality of stripe electrodes 28L arranged in parallel and electrically connected together, and a plurality of slits 28S arranged between the stripe electrodes 28L. The gate pad upper electrode 28G is electrically connected to the gate pad lower electrode 12P through the second contact hole 262, and the data pad upper electrode 28D is electrically connected to the data pad lower electrode 24P through the third contact hole 263. The connection line 28C is electrically connected to the common electrode 16C through the fourth contact hole 264 and electrically connected to the common line CL through the fifth contact hole 265.

In conclusion, the present invention forms the gate lines, the gate electrodes and the common electrode by the same photolithographic process, and thus the complexity of the manufacturing process and the cost of the FFS mode LCD panel are reduced.

Those skilled in the art will readily observe that numerous modifications and alterations of the device and method may be made while retaining the teachings of the invention.

What is claimed is:

1. A method of forming an array substrate of a fringe field switching (FFS) mode liquid crystal display (LCD) panel, comprising:
    providing a substrate;
    forming a plurality of gate lines, a plurality of gate electrodes and a common electrode on the substrate by a first photolithographic process, the first photolithographic process comprising:
        forming a first conducting layer on the substrate, and forming a patterned photoresist on the first conducting layer;
        removing the first conducting layer unblocked by the patterned photoresist to form the gate lines and the gate electrodes on the substrate;
        forming a first transparent conducting layer covering the substrate and the patterned photoresist;
        striping the patterned photoresist as well as the first transparent conducting layer which covers the patterned photoresist to form the common electrode on the substrate;
    forming a gate insulating layer which covers the substrate, the gate lines, the gate electrodes and the common electrode;
    forming a semiconductor layer on the gate insulating layer by a second photolithographic process;
    forming a plurality of data lines, a plurality of source electrodes and a plurality of drain electrodes on the gate insulating layer and the semiconductor layer by a third photolithographic process;
    forming a passivation layer on the gate insulating layer, the data lines, the source electrodes and the drain electrodes by a fourth photolithographic process, wherein the passivation layer has a plurality of first contact holes, and each of the first contact holes at least partially exposing the drain electrodes; and
    forming a plurality of pixel electrodes on the passivation layer by a fifth photolithographic process, wherein each of the pixel electrodes is electrically connected to the corresponding drain electrode through the corresponding first contact hole.

2. The method of forming the array substrate of the FFS mode LCD panel of claim 1, wherein the first conducting layer is etched in the first photolithographic process so that a width of each of the gate lines is smaller than a width of the patterned photoresist disposed thereon, and a width of each of the gate electrodes is smaller than a width of the patterned photoresist disposed thereon.

3. The method of forming the array substrate of the FFS mode LCD panel of claim 1, wherein each of the pixel electrodes has a plurality of stripe electrodes arranged in parallel and electrically connected together, and a plurality of slits arranged between the stripe electrodes.

4. The method of forming the array substrate of the FFS mode LCD panel of claim 1, wherein each of the gate lines comprises a gate pad lower electrode, each of the data lines comprises a data pad lower electrode, the passivation layer and the gate insulating layer have a plurality of second contact holes, the passivation layer has a plurality of third contact holes, the passivation layer and the gate insulating layer further have a plurality of fourth contact holes, each of the second contact holes partially exposes the corresponding gate pad lower electrode, each of the third contact holes partially exposes the corresponding data pad lower electrode, and each of the fourth contact holes partially exposes the common electrode.

5. The method of forming the array substrate of the FFS mode LCD panel of claim 4, further comprising forming a plurality of gate pad upper electrodes and a plurality of data pad upper electrodes by the fifth photolithographic process, wherein each of the gate pad upper electrodes is electrically connected to the corresponding gate pad lower electrode through the second contact hole, and each of the data pad upper electrodes is electrically connected to the corresponding data pad lower electrode through the third contact hole.

6. The method of forming the array substrate of the FFS mode LCD panel of claim 1, further comprising forming a common line by the first photolithographic process.

7. The method of forming the array substrate of the FFS mode LCD panel of claim 6, wherein the passivation layer and the gate insulating layer further have a plurality of fifth contact holes, and each of the fifth contact holes partially exposes the common line.

8. The method of forming the array substrate of the FFS mode LCD panel of claim 7, further comprising forming a connection line by the fifth photolithographic process, wherein the connection line is electrically connected to the common electrode through the fourth contact hole and electrically connected to the common line through the fifth contact hole.

9. The method of forming the array substrate of the FFS mode LCD panel of claim 1, wherein a gap substantially ranging from 0.2 micrometers to 2 micrometers exists between the gate line and the common electrode, and a gap substantially ranging from 0.2 micrometers to 2 micrometers exists between the gate electrodes and the common electrode.

10. An array substrate of a fringe field switching (FFS) mode liquid crystal display (LCD) panel, comprising:
　a substrate;
　a gate line disposed on the substrate;
　a data line disposed on the substrate;
　a thin film transistor disposed on the substrate, wherein the thin film transistor comprises:
　　a gate electrode electrically connected to the gate line;
　　a gate insulating layer disposed on the gate electrode;
　　a semiconductor layer disposed on the gate insulating layer; and
　　a source electrode and a drain electrode disposed on the semiconductor layer, wherein the source electrode is electrically connected to the data line;
　a common electrode disposed between the substrate and the gate insulating layer, wherein the common electrode, the gate electrode and the gate line are coplanar;
　a passivation layer disposed on the gate insulating layer, wherein the passivation layer has a first contact hole at least partially exposing the drain electrode, wherein a fourth contact hole and a fifth contact hole are defined in both of the passivation layer and the gate insulating layer, and the common electrode is exposed through the fourth contact hole;
　a pixel electrode disposed on the passivation layer, wherein the pixel electrode is electrically connected to the drain electrode through the first contact hole;
　a common line disposed on the substrate and being exposed through the fifth contact hole; and
　a connection line disposed on the passivation layer, electrically connected to the common electrode through the fourth contact hole, and electrically connected to the common line through the fifth contact hole, such that the common electrode is electrically connected to the common line via the connection line connected between the common electrode and the common line.

11. The array substrate of the FFS mode LCD panel of claim 10, wherein the pixel electrode has a plurality of stripe electrodes arranged in parallel and electrically connected together, and a plurality of slits arranged between the stripe electrodes.

12. The array substrate of the FFS mode LCD panel of claim 10, further comprising a gate pad lower electrode electrically connected to the gate line, and a data pad lower electrode electrically connected to the data line, wherein the passivation layer and the gate insulating layer have a second contact hole exposing the gate pad lower electrode, and the passivation layer has a third contact holes exposing the data pad lower electrode.

13. The array substrate of the FFS mode LCD panel of claim 12, further comprising a gate pad upper electrode and a data pad upper electrode, wherein the gate pad upper electrode is electrically connected to the gate pad lower electrode through the second contact hole, and the data pad upper electrode is electrically connected to the data pad lower electrode through the third contact hole.

14. The array substrate of the FFS mode LCD panel of claim 13, wherein the gate pad upper electrode, the data pad upper electrode and the pixel electrode are made of the same transparent conducting material.

15. The array substrate of the FFS mode LCD panel of claim 10, wherein the common line, the gate electrode and the gate line are made of the same conducting material.

16. The array substrate of the FFS mode LCD panel of claim 10, wherein a gap substantially ranging from 0.2 micrometers to 2 micrometers exists between the gate line and the common electrode, and a gap substantially ranging from 0.2 micrometers to 2 micrometers exists between the gate electrode and the common electrode.

17. The array substrate of the FFS mode LCD panel of claim 10, wherein a gap substantially ranging from 0.2 micrometers to 2 micrometers exists between the common line and the common electrode.

18. The array substrate of the FFS mode LCD panel of claim 11, wherein the connection line is substantially parallel to the stripe electrodes.

19. The array substrate of the FFS mode LCD panel of claim 18, wherein the common line is substantially parallel to the stripe electrodes.

20. The array substrate of the FFS mode LCD panel of claim 11, further comprising a common signal line disposed on the connection line and electrically connected to the connection line, wherein a common signal is applied via the common signal line to the connection line.

\* \* \* \* \*